US012751326B2

(12) United States Patent
Wong et al.

(10) Patent No.: US 12,751,326 B2
(45) Date of Patent: Sep. 29, 2026

(54) STACKED CHIP SCALE SEMICONDUCTOR DEVICE

(71) Applicant: Sandisk Technologies, Inc., Milpitas, CA (US)

(72) Inventors: Chee Seng Wong, Penang (MY); Yoong Tatt Chin, Penang (MY); Wei Chiat Teng, Penang (MY)

(73) Assignee: Sandisk Technologies, Inc., Milpitas, CA (US)

( * ) Notice: Subject to any disclaimer, the term of this patent is extended or adjusted under 35 U.S.C. 154(b) by 615 days.

(21) Appl. No.: 18/222,646

(22) Filed: Jul. 17, 2023

(65) Prior Publication Data

US 2024/0243101 A1 Jul. 18, 2024

Related U.S. Application Data

(60) Provisional application No. 63/439,737, filed on Jan. 18, 2023.

(51) Int. Cl.

| | |
|---|---|
| ***H10W 90/00*** | (2026.01) |
| ***H10W 70/654*** | (2026.01) |
| ***H10W 72/29*** | (2026.01) |
| ***H10W 72/90*** | (2026.01) |
| ***H10W 74/10*** | (2026.01) |
| ***H10W 90/22*** | (2026.01) |
| ***H10W 90/24*** | (2026.01) |

(52) U.S. Cl.

CPC ........... *H10W 90/00* (2026.01); *H10W 72/90* (2026.01); *H10W 74/129* (2026.01); *H10W 70/654* (2026.01); *H10W 72/29* (2026.01); *H10W 72/9445* (2026.01); *H10W 90/22* (2026.01); *H10W 90/24* (2026.01)

(58) Field of Classification Search

CPC ..................................................... H01W 72/90

See application file for complete search history.

(56) References Cited

U.S. PATENT DOCUMENTS

| | | | | |
|---|---|---|---|---|
| 11,024,604 | B2 * | 6/2021 | Bowers | H10W 70/09 |
| 11,257,788 | B2 * | 2/2022 | Fang | H10P 54/00 |
| 12,062,635 | B2 * | 8/2024 | Yang | H10W 20/042 |

(Continued)

FOREIGN PATENT DOCUMENTS

| | | | |
|---|---|---|---|
| KR | 100488256 | B1 | 5/2005 |
| KR | 20100002858 | A | 1/2010 |

(Continued)

*Primary Examiner* — William A Harriston
(74) *Attorney, Agent, or Firm* — Pearl Cohen LLP

(57) ABSTRACT

A stacked chip scale semiconductor device includes one or more semiconductor die stacks. Each semiconductor die stack may include a pair of semiconductor dies. A first of the pair of semiconductor dies may be provided with a pattern of contact pads distributed across its major surface configured to be flip chip bonded to a host device. A second of the pair of semiconductor dies may include a row of contact pads. The first semiconductor die may be bonded on top of the second semiconductor die in an offset, stepped configuration so that the row of contact pads of the second semiconductor die is left exposed. Like channels of contact pads on the first and second semiconductor dies may then be electrically coupled by additive manufacturing or conductive trace printing.

18 Claims, 8 Drawing Sheets

(56) References Cited

U.S. PATENT DOCUMENTS

| | | | | |
|---|---|---|---|---|
| 2008/0303131 | A1* | 12/2008 | McElrea | H10D 62/117<br>257/E23.001 |
| 2010/0181661 | A1* | 7/2010 | Takemoto | H10W 90/00<br>257/E23.141 |
| 2015/0221586 | A1* | 8/2015 | Paek | H10W 72/20<br>257/668 |
| 2018/0294251 | A1* | 10/2018 | Liu | H10W 70/611 |
| 2020/0411484 | A1* | 12/2020 | Jang | H10W 74/111 |

FOREIGN PATENT DOCUMENTS

| | | | |
|---|---|---|---|
| KR | 20100020518 | A | 2/2010 |
| KR | 20150091933 | A | 8/2015 |
| KR | 20210000812 | A | 1/2021 |

* cited by examiner

STACKED CHIP SCALE SEMICONDUCTOR DEVICE

CLAIM OF PRIORITY

The present application claims priority from U.S. Provisional Patent Application No. 63/439,737, entitled "STACKED CHIP SCALE SEMICONDUCTOR DEVICE," filed, Jan. 18, 2023, which is incorporated by reference herein in its entirety.

BACKGROUND

The strong growth in demand for portable consumer electronics is driving the need for high-capacity storage devices. Non-volatile semiconductor memory devices, such as flash memory cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Semiconductor memory may be provided within a semiconductor package, which protects the semiconductor memory and enables communication between the memory and a host device. Examples of semiconductor packages include system-in-a-package (SiP) or multichip modules (MCM), where one or more semiconductor dies are mounted and interconnected on a small footprint substrate. There are various configurations for electrically connecting the dies to each other and the substrate. In one configuration, the dies are electrically interconnected using bond wires. This configuration allows multiple stacked semiconductor dies, but the bond wires add to the height of the overall package. It is also known to mount a semiconductor die by bonding balls or bumps on the semiconductor die and then mounting the die to the substrate in a so-called flip-chip arrangement. While minimizing the thickness of the package, this configuration conventionally allows for only a single semiconductor die to be used in the package.

DETAILED DESCRIPTION

Figure 1:
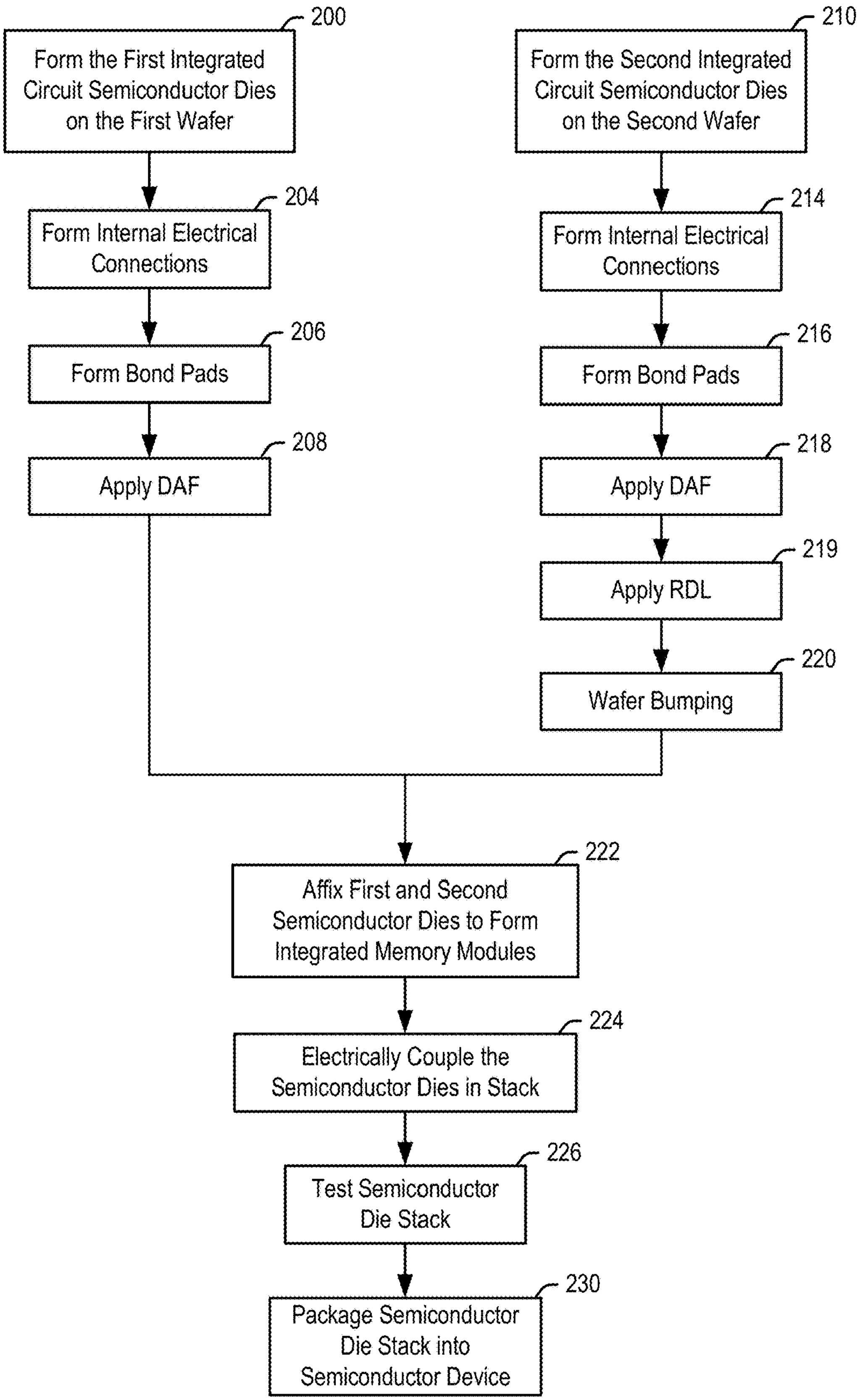
FIG. 1 is a flowchart for forming a semiconductor device according to embodiments of the present technology.

The present technology will now be described with reference to the figures, which in embodiments, relate to a stacked chip scale semiconductor device including one or more semiconductor die stacks. Each semiconductor die stack may include a pair of semiconductor dies. A first of the pair of semiconductor dies may be provided with a pattern of contact pads distributed across its major surface configured to be flip chip bonded to a host device. A second of the pair of semiconductor dies may include a row of contact pads. The semiconductor die stack may be formed by bonding the first semiconductor die on top of the second semiconductor die in an offset, stepped configuration so that the row of contact pads of the second semiconductor die is left exposed.

Like channels of contact pads on the first and second semiconductor dies may then be electrically coupled as by additive manufacturing or conductive trace printing. In further embodiments, the semiconductor die stack may include a first semiconductor die 102 bonded to a number of second semiconductor dies. Two or more semiconductor die stacks may be encapsulated together to form a semiconductor device which may then be flip chip bonded to a host device.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is +1.5 mm, or alternatively, +2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 2:
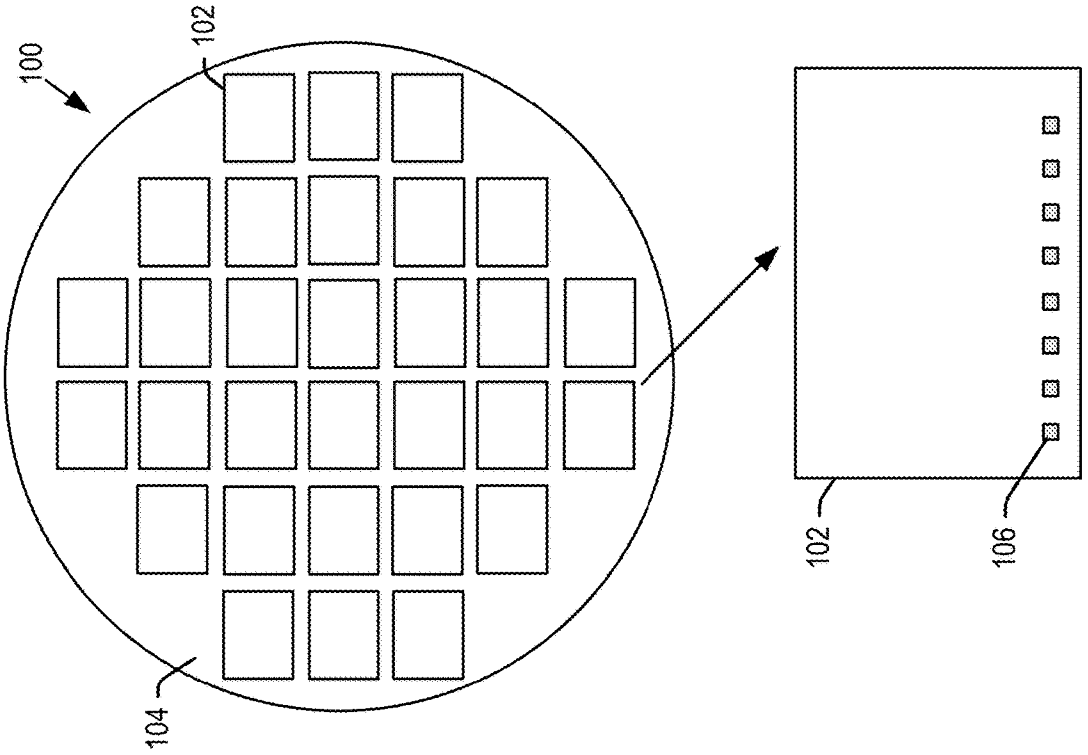
FIG. 2 is a top view of a first semiconductor wafer, and a first semiconductor dies therefrom, according to embodiments of the present technology.

An embodiment of the present technology will now be explained with reference to the flowchart of FIG. 1, and the views of FIGS. 2-14. In step 200, a first semiconductor wafer 100 may be processed into a number of first semiconductor dies 102 as shown in FIG. 2. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The semiconductor wafer 100 may be cut from the ingot and polished on both the first major surface 104, and second major surface 105 (FIG. 4) opposite surface 104, to provide smooth surfaces. The first major surface 104 may undergo various processing steps to divide the wafer 100 into the respective first semiconductor dies 102, and to form integrated circuits of the respective first semiconductor dies 102 on and/or in the first major surface 104.

Figure 4:
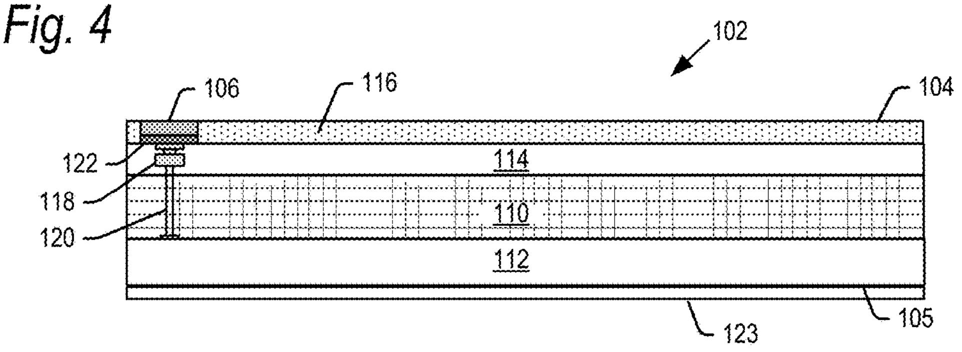
FIG. 4 is a cross-sectional edge view of a first semiconductor dies according to embodiments of the present technology.

In particular, in step 200, the first semiconductor dies 102 may be processed in a FEOL (front end of line) step to include integrated circuit memory cell array 110 formed in a dielectric substrate including dielectric layers 112 and 114 as shown in the cross-sectional edge view of FIG. 4. In embodiments, the memory cell array 110 may be formed as a 3D stacked memory structure having strings of memory cells formed into layers. Such semiconductor dies 102 may for example be 3D BiCS (Bit Cost Scaling), V-NAND or other 3D flash memory. However, dies 102 may be other types of dies, including for example 2D NAND flash memory dies, a controller die such as an ASIC, or RAM such as an SDRAM, DDR SDRAM, LPDDR and GDDR. A passivation layer 116 may be formed on top of the upper dielectric film layer 114.

After formation of the memory cell array 110, a BEOL (back end of line) step 204 may form internal electrical connections within the first semiconductor dies 102. The internal electrical connections may include multiple layers of metal interconnects 118 and vias 120 formed in successive damascene or dual-damascene processes sequentially through layers of the dielectric film 114. The metal interconnects 118, vias 120 and dielectric film layers 114 may be formed a layer at a time using photolithographic and thin-film deposition processes. The photolithographic processes may include for example pattern definition, plasma, chemical or dry etching and polishing. The thin-film deposition processes may include for example chemical vapor deposition (CVD), physical vapor deposition (PVD), sputtering or electrografting (eG). The metal interconnects 118 may be formed of a variety of electrically conductive metals including for example copper aluminum and alloys of copper and/or aluminum as is known in the art, and the vias 120 may be lined and/or filled with a variety of electrically conductive metals including for example tungsten, copper and copper alloys as is known in the art.

In step 206, electrically conductive pads may be formed on the major surface 104 of the first semiconductor dies 102. As shown in FIGS. 2 and 4, these electrically conductive pads may include a row of bond pads 106. The bond pads 106 may be formed of copper, aluminum and alloys of copper and/or aluminum as is known in the art. The bond pads 106 are provided for transferring signals to and from the memory cell array 110 through the metal interconnects 118 and vias 120. In embodiments, the semiconductor dies 102 on wafer 100 are formed with a single row of bond pads 106, for example configured to receive bond wires.

The passivation layer 116 may be etched, and each bond pad 106 may be formed over a liner 122 in the etched regions of the passivation layer. The bond pads 106, and liner 122 may be applied by vapor deposition and/or plating techniques. FIG. 2 shows semiconductor dies 102 on wafer 100, and bond pads 106 in a row on one of the semiconductor dies 102. The number of first semiconductor dies 102 shown on wafer 100 in FIG. 2 is for illustrative purposes, and wafer 100 may include more first semiconductor dies 102 than are shown in further embodiments. Similarly, the pattern of bond pads 106 as well as the number of bond pads 106, on the first semiconductor die 102 are shown for illustrative purposes. Each first die 102 may include more bond pads 106 than are shown in further embodiments, and may include various other patterns of bond pads 106, including for example multiple rows of bond pads 106. A die attach film (DAF) layer 123 may be spin coated or otherwise applied to the second major surface 105 in step 208.

Figure 3:
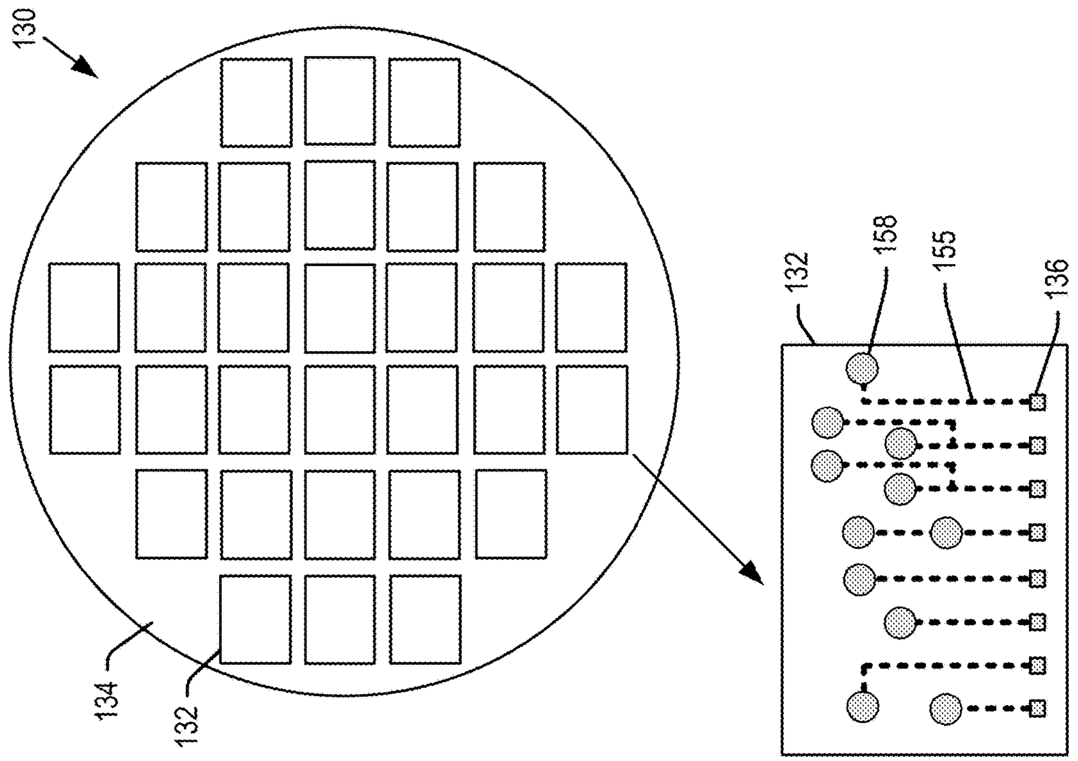
FIG. 3 is a top view of a second semiconductor wafer, and a second semiconductor dies therefrom, according to embodiments of the present technology.

Before, after or in parallel with the formation of the first semiconductor dies on wafer 100, a second semiconductor wafer 130 may be processed into a number of second semiconductor dies 132 in step 210 as shown in FIG. 3. The second semiconductor wafer 130 may start as an ingot of monocrystalline silicon grown according to either a CZ, FZ or other process. The second semiconductor wafer 130 may be cut and polished on both the first major surface 134, and second major surface 135 (FIG. 5) opposite surface 134, to provide smooth surfaces. The first major surface 134 may undergo various processing steps to divide the second wafer 130 into the respective second semiconductor dies 132, and to form integrated circuits of the respective second semiconductor dies 132 on and/or in the first major surface 134.

Figure 5:
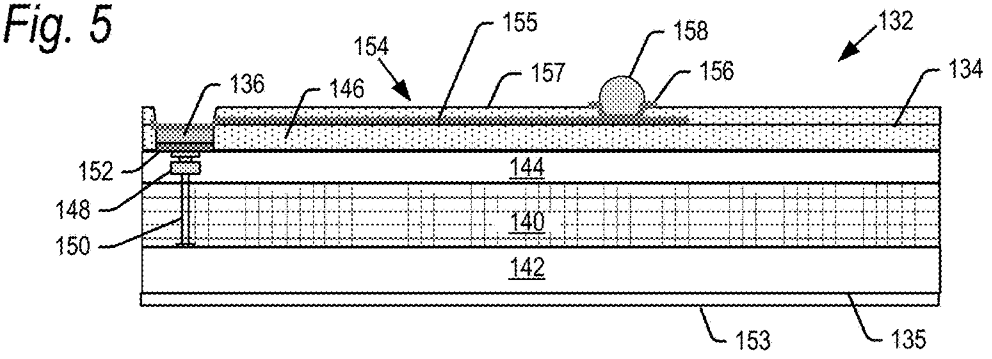
FIG. 5 is a cross-sectional edge view of a second semiconductor dies according to embodiments of the present technology.

In one embodiment, the second semiconductor dies 132 may be processed to include integrated circuit memory cell arrays 140 formed in a dielectric substrate including layers 142 and 144 as shown in the cross-sectional edge view of FIG. 5. In embodiments, the memory cell array 140 may be formed as a 3D stacked memory structure having strings of memory cells formed into layers. Such semiconductor dies 132 may for example be 3D BiCS (Bit Cost Scaling), V-NAND or other 3D flash memory. However, dies 132 may be other types of dies, including for example 2D NAND flash memory dies, a controller die such as an ASIC, or RAM such as an SDRAM, DDR SDRAM, LPDDR and GDDR. A passivation layer 146 may be formed on top of the upper dielectric film layer 144.

After formation of the memory cell array 140, a BEOL step 214 may form internal electrical connections within the second semiconductor dies 132. The internal electrical connections may include multiple layers of metal interconnects 148 and vias 150 formed in successive damascene or dual-damascene processes sequentially through layers of the dielectric film 144. The metal interconnects 148, vias 150 and dielectric film layers 144 may be formed a layer at a time using photolithographic and thin-film deposition processes. The photolithographic processes may include for example pattern definition, plasma, chemical or dry etching and polishing. The thin-film deposition processes may include for example chemical vapor deposition (CVD), physical vapor deposition (PVD), sputtering or electrografting (eG). The metal interconnects 148 may be formed of a variety of electrically conductive metals including for example copper aluminum and alloys of copper and/or aluminum as is known in the art, and the vias 150 may be lined and/or filled with a variety of electrically conductive metals including for example tungsten, copper and copper alloys as is known in the art.

In step 216, electrically conductive pads may be formed on the major surface 134 of the second semiconductor dies 132. As shown in FIGS. 2 and 5, these electrically conductive pads may include a row of bond pads 136. The bond pads 136 may be formed of copper, aluminum and alloys of copper and/or aluminum as is known in the art. The bond pads 136 are provided for transferring signals to and from the integrated circuits 140 through the metal interconnects 148 and vias 150.

The passivation layer 146 may be etched, and each bond pad 136 may be formed over a liner 152 in the etched regions of the passivation layer. The bond pads 136, and liner 152 may be applied by vapor deposition and/or plating techniques. FIG. 3 shows semiconductor dies 132 on wafer 130, and bond pads 136 on one of the semiconductor dies 132. The number of second semiconductor dies 132 shown on wafer 130 in FIG. 3 is for illustrative purposes, and wafer 130 may include more second semiconductor dies 132 than are shown in further embodiments. Similarly, the number of bond pads 136 is shown for illustrative purposes. Each second die 132 may include more bond pads 136 than are shown in further embodiments. In embodiments, there may be same number of bond pads 136 in the row of bond pads 136 on die 132 as there are bond pads 106 in the row of bond pads 106 at the edge of die 102. A DAF layer 153 may be spin coated or otherwise applied to the second major surface 135 in step 218.

At this point in the fabrication of wafer 130, the dies 132 may be identical to dies 102 in wafer 100. However, wafer 130 may undergo further (post) processing steps 219 and 220 to effectively redistribute the bond pads 136 to positions distributed across the first major surface 134 of dies 132. In step 219, a redistribution layer (RDL) 154 may be formed over the first major surface 134 of the dies 132 on wafer 130. As seen for example in FIGS. 3, 5 and 7, RDL 154 may include electrical traces 155 electrically coupled between the electrically conductive pads 136 and electrically conductive pads 156 of the RDL 154 at positions distributed across the surface of dies 132. As seen in FIG. 5, a dielectric insulating layer 157 may then be applied over the surface 134 to cover and insulate the traces 155. The insulating layer 157 may leave the conductive pads 156 exposed to receive solder bumps as explained below. The insulating layer 157 may also leave the bond pads 136 exposed to receive printed traces as explained below.

After formation of the RDL 154, solder bumps 158 may be applied to the conductive pads 156 in step 220. The bumps 158 may be solder, but may also be formed of copper, aluminum tin, gold, alloys thereof, or other flowable metals and materials. The solder (or other) bumps 158 may for example be formed in a wafer bumping process.

Application of the RDL 154 and solder bumps 158 effectively redistributes the row of contact pads 136 to positions across the surface of dies 132. Without RDL 154 and solder bumps 158, the dies 132 may be configured to receive bond wires on the row of contact pads 136 (as in dies 102). However, the addition of RDL 154 and solder bumps 158 effectively convert dies 132 into flip-chip type semiconductor dies which can be bonded by solder bumps 158 directly to a host device as explained below. The pattern of conductive pads 156 and solder bumps 158 shown in the figures is by way of example only, and it is understood that the RDL 154 may be used to effectively redistribute the bond pads 136 to any of a wide variety of positions and patterns on the surface of dies 132.

Figure 6:
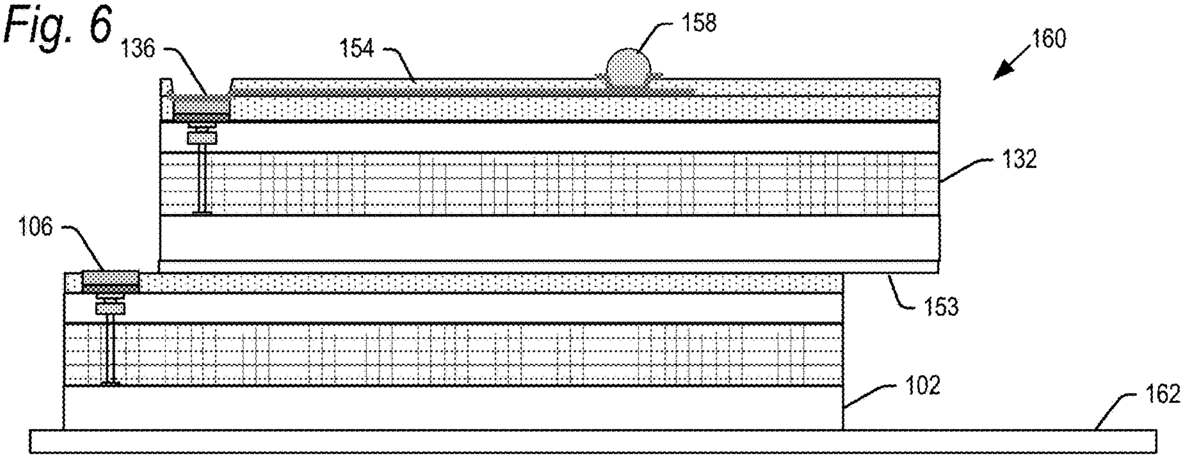
FIGS. 6 and 7 are a cross-sectional edge view and a perspective view of a semiconductor die stack including a first semiconductor dies bonded to a second semiconductor dies according to embodiments of the present technology.
Figure 7:
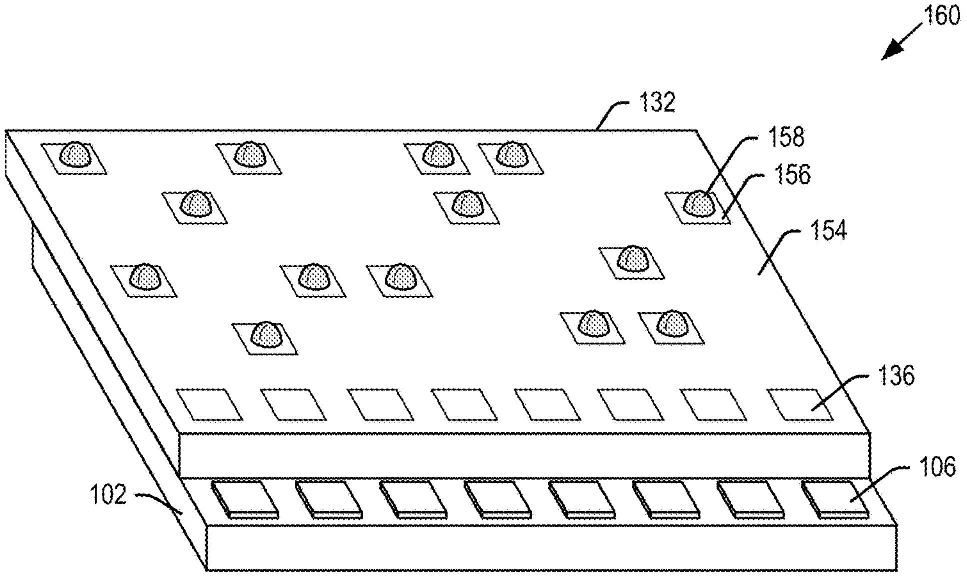

Once the fabrication of first and second semiconductor dies 102 and 132 is complete, the first and second semiconductor dies may be diced from their respective wafers 100, 130, and affixed to each other in step 222 to form a semiconductor die stack 160 as shown for example in the cross-sectional edge view of FIG. 6 and the perspective view of FIG. 7. The first die 102 may be supported on a temporary carrier 162 as shown in FIG. 6, and then the second die 132 may be mounted on top of the first semiconductor die 102. The second die 132 may be affixed onto the first die 102 using DAF layer 153, which may be subsequently cured to permanently affix the first and second dies 102, 132 together in stack 160. As shown, once the dies 102, 132 are affixed to each other, the bond pads 106 on the first (bottom) die 102 may remain exposed to enable electrical coupling of the dies 102, 132 as will now be explained.

Figure 8:
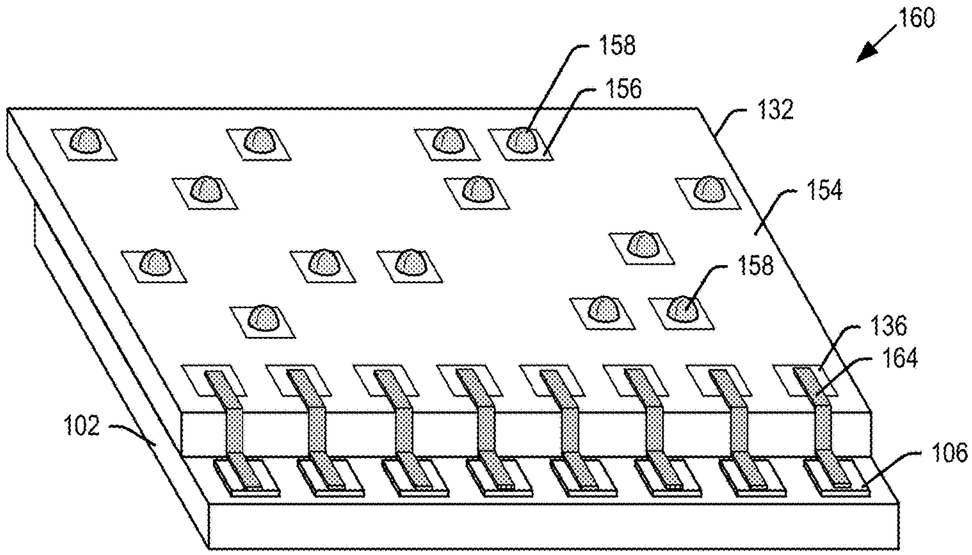
FIG. 8 is a perspective view of an electrically semiconductor die stack according to embodiments of the present technology.
Figure 9A:
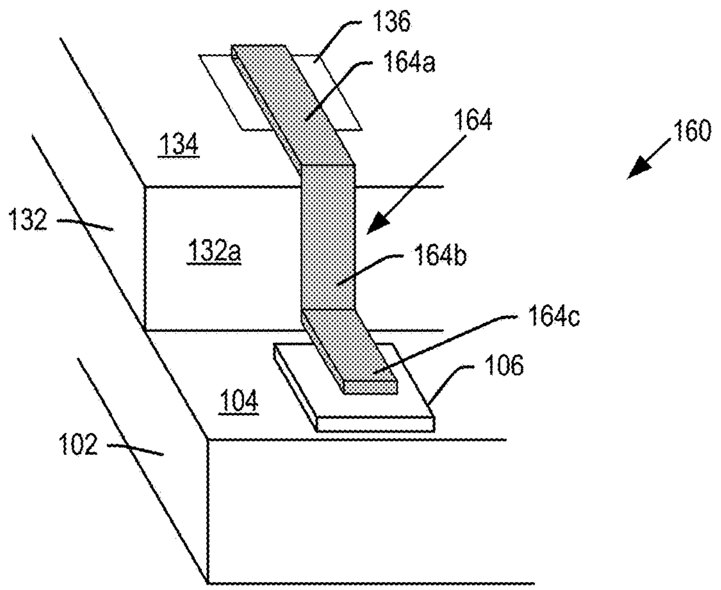
FIGS. 9A and 9B are enlarged views of a section of the semiconductor die stack according to embodiments of the present technology.
Figure 9B:
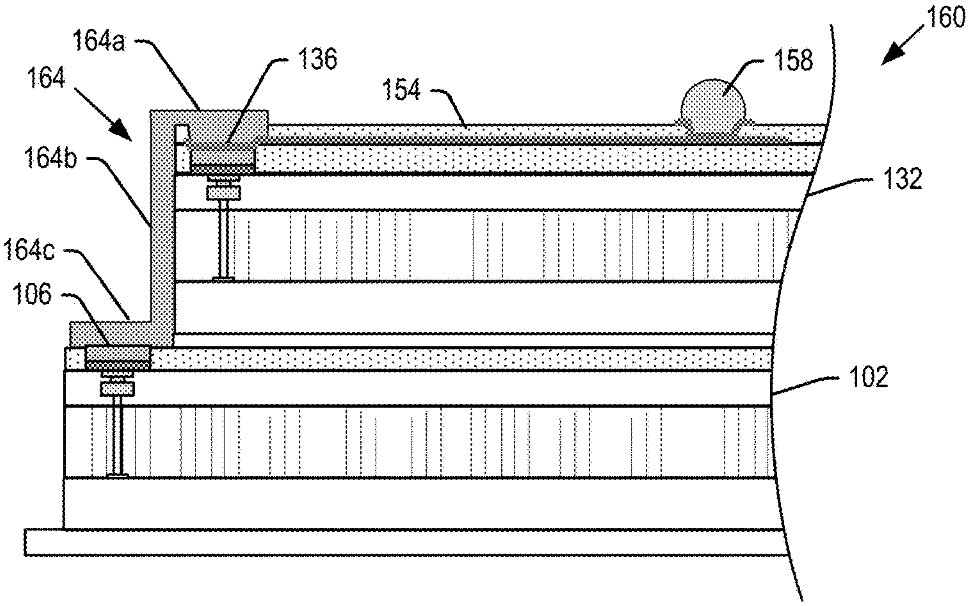

In step 224, like channels of the first and second semiconductor dies may be electrically coupled to each other using low height conductive traces 164 as shown in the perspective view of FIG. 8 and the enlarged views of FIGS. 9A and 9B The row of bond pads 136 at the edge of die 132 may be devoid of solder bumps 158. Each bond pad 136 in this row may be electrically coupled to its corresponding (like channel) bond pad 106 in die 102 using a low height conductive trace 164. In one embodiment, the low height conductive traces 164 may be formed by additive manufacturing. Additive manufacturing, also known as 3D printing, is a process by which traces 164 may be formed by depositing conductive material layer by layer on horizontal and vertical surfaces of dies 102, 132.

FIGS. 9A and 9B are enlarged perspective and cross-sectional views of a portion of die stack 160. The die 132 includes horizontal major surface 134 having bond pads 136, and a vertical edge surface 132*a*. The die 102 includes horizontal major surface 104 having bond pads 106. In accordance with aspects of the present technology, the low height conductive traces 164 may be formed by additive manufacturing so that a first portion 164*a* of a trace 164 is formed in contact with the contact pad 136 and major surface 134, a second portion 164*b* of trace 164 is formed in contact with the vertical edge surface 132*a*, and a third portion 164*c* of trace 164 is formed in contact with the contact pad 106 and major surface 104.

In embodiments, the portions 164*a* and 164*c* are in direct contact with bond pads 136 and 106, respectively, and the portions 164*a*, 164*b* and/or 164*c* are in direct contact with surfaces 134, 132*a* and/or 104. In further embodiments, the portions 164*a* and 164*c* are in direct contact with bond pads 136 and 106, respectively, and the portions 164*a*, 164*b* and/or 164*c* are in indirect contact with surfaces 134, 132*a* and/or 104. In this latter embodiment, the portions 164*a*, 164*b* and/or 164*c* may be in direct contact with an insulating layer on the surfaces 134, 132*a* and/or 104.

There are several different methods of additive manufacturing that can be used to create conductive traces 164. In one example, the traces 164 may be 3D printed by direct ink writing. This method involves depositing a conductive ink or paste onto the horizontal and vertical surfaces of dies 102, 132 to create the electrical traces that electrically couple corresponding bond pads 106 and 136. The conductive ink may be deposited through a nozzle or print head, which can be controlled to create the desired trace pattern in 3D.

In a further example, the traces 164 may be 3D printed by powder bed fusion. In this method, a layer of conductive powder may be deposited onto the horizontal and vertical surfaces of dies 102, 132. The power may then be selectively cured or fused in the pattern of the conductive traces 164, such as by a laser or electron beam which cures the powder only in the areas where the traces 164 are to remain. The powder that does not get heated and cured may be removed, leaving the desired pattern of traces 164.

In a further example, the traces 164 may be 3D printed by extrusion-based printing. In this method, the conductive traces 164 may be extruded through a nozzle onto the horizontal and vertical surfaces of dies 102, 132 to create the electrical traces that electrically couple corresponding bond pads 106 and 136. The nozzle can be controlled to create the desired trace pattern in 3D to transition over and between the horizontal and vertical surfaces between the contact pads 106 and 136.

It is understood that the low height conductive traces 164 may be formed by other methods in further embodiments. One such further method is by screen printing. In this embodiment, conductive ink or paste may be applied to the horizontal and vertical surfaces between the bond pads 106 and 136. A blocking stencil may be used to ensure the conductive ink only gets printed in the areas where the conductive traces 164 are to be formed. The ink or paste may be applied to the empty areas of the stencil through a nozzle and pressed into the empty areas of the stencil as by a squeegee or blade.

The low height conductive traces 164 may be formed of metals such as copper or aluminum, but may be formed of other materials such as gold, silver, alloys thereof, or other electrically conductive metals and materials. The low height conductive traces may be formed to a thickness of 20 micron (μm) to 100 μm, such as for example 50 μm. The traces 164 may be thinner or thicker than that in further embodiments. The width of the low height conductive traces may range from 100 μm to the width of the contact pads 106, 136, though the traces 164 may be thinner than that in further embodiments.

Figure 10:
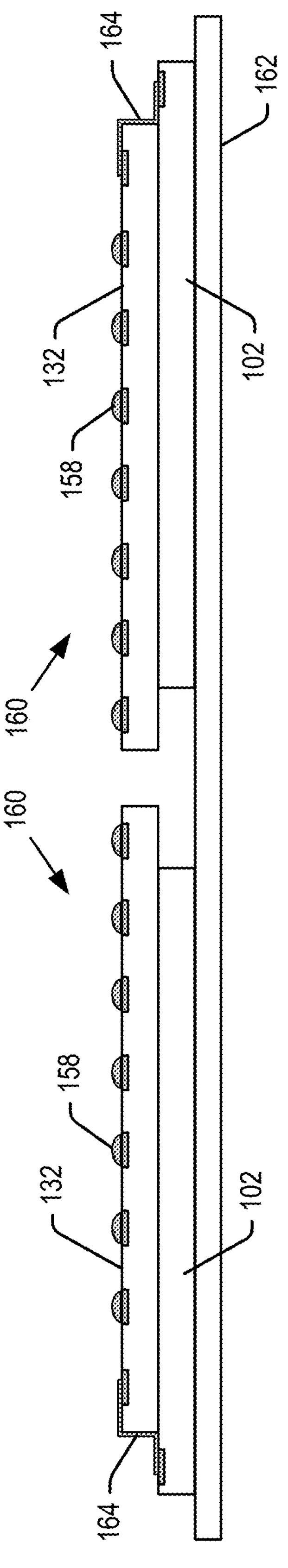
FIG. 10 is a cross-sectional edge view of a semiconductor device including a pair of electrically semiconductor die stacks according to embodiments of the present technology.
Figure 11:
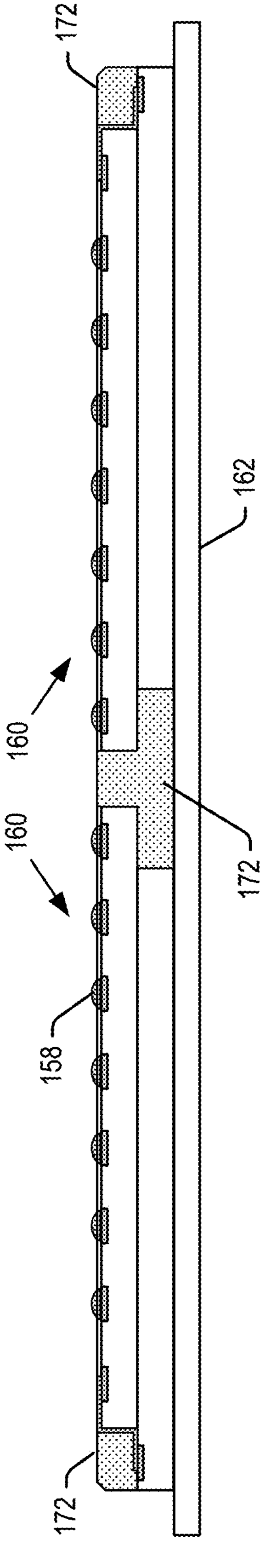
FIG. 11 is a cross-sectional edge view of a completed semiconductor device including a pair of electrically semiconductor die stacks according to embodiments of the present technology.

Referring again to FIG. 1, after the first and second dies 102, 132 are formed and coupled to each other into the semiconductor die stack 160, the semiconductor die stack 160 may be tested in step 226 as is known, for example with read/write and burn in operations. Thereafter, in step 230, one or more semiconductor die stacks 160 may be packaged into a semiconductor device 170, as shown in FIGS. 10-14. FIG. 10 shows a semiconductor device 170 including a pair of semiconductor die stacks 160. The stacks 160 may be supported on a temporary carrier such as carrier 162 as shown in FIG. 10, and then encapsulated in a molding compound 172 as shown in FIG. 11.

In FIGS. 10 and 11, the stacks 160 are shown positioned in opposite directions from each other as shown, with the low height conductive traces 164 in the respective stacks 160 spaced distally from each other. In further embodiments, the stacks 160 may be positioned with the traces 164 positioned adjacent to each other. In further embodiments, the stacks 160 may face in the same direction, with the traces 164 in both stacks facing left, or the traces in both stacks facing right.

In addition to adhering the pair of stacks 160 together, the molding compound 172 can encase and protect the contact pads 106, 136 as well as the low height conductive traces 164. The solder bumps 158 of the second semiconductor dies 132 in each of the stacks 160 remains exposed through the surface of the molding compound 172 as shown in FIG. 11. Molding compound 172 may include for example solid epoxy resin, Phenol resin, fused silica, crystalline silica, carbon black and/or metal hydroxide. Other molding compounds are contemplated. The molding compound may be applied by various known processes, including by FFT (flow free thin) molding, compression molding, transfer molding or injection molding techniques. The molding compound may further be applied by known processes such as localized molding process, additive manufacturing, printed molding process or using a “dam and fill” method of encapsulation.

Figure 12:
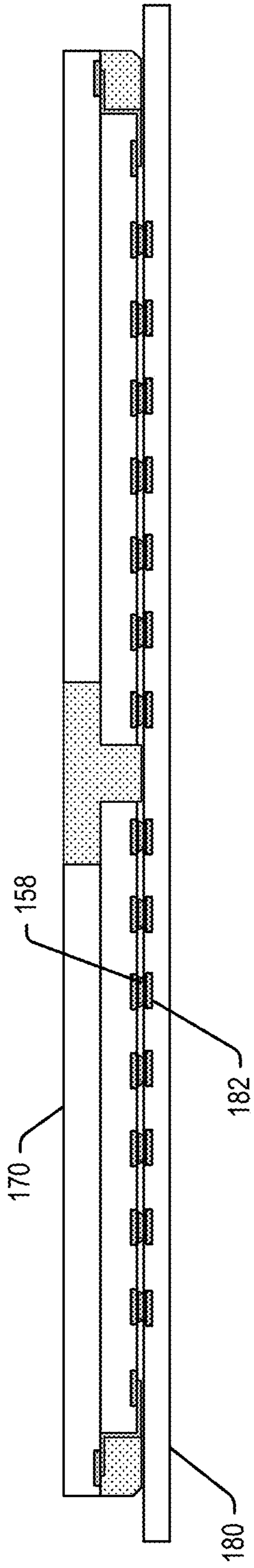
FIG. 12 is a cross-sectional edge view of a completed semiconductor device according to embodiments of the present technology mounted to a host device.

Referring now to the cross-sectional edge view of FIG. 12, the finished semiconductor device 170 may be removed from the temporary carrier 162, flipped over, and mounted on a host device 180, such as for example a printed circuit board (PCB). The host device 180 may include a number of contact pads 182 corresponding in number and pattern to the solder bumps 158 exposed to the surface of semiconductor device 170. In particular, in embodiments, solder bumps 158 are positioned in semiconductor device 170 so that, once the semiconductor device 170 is flipped over, the positions of the solder bumps 158 in the device 170 correspond to the positions of contact pads 182 on the host device 180. The semiconductor device 170 may be heated to melt the solder bumps 158, to physically and electrically couple the semiconductor device 170 to the host device 180 in a flip chip mounting configuration.

In the embodiment of semiconductor device 170 shown in FIGS. 10-12, the semiconductor device 170 includes a pair of semiconductor stacks 160. It is understood that the semiconductor device 170 may include a single semiconductor stack 160, or more than two semiconductor stacks 160 in further embodiments. In examples, the semiconductor device 170 may include any number between three and sixteen semiconductor stacks 160, though there may be more in further embodiments.

Figure 13:
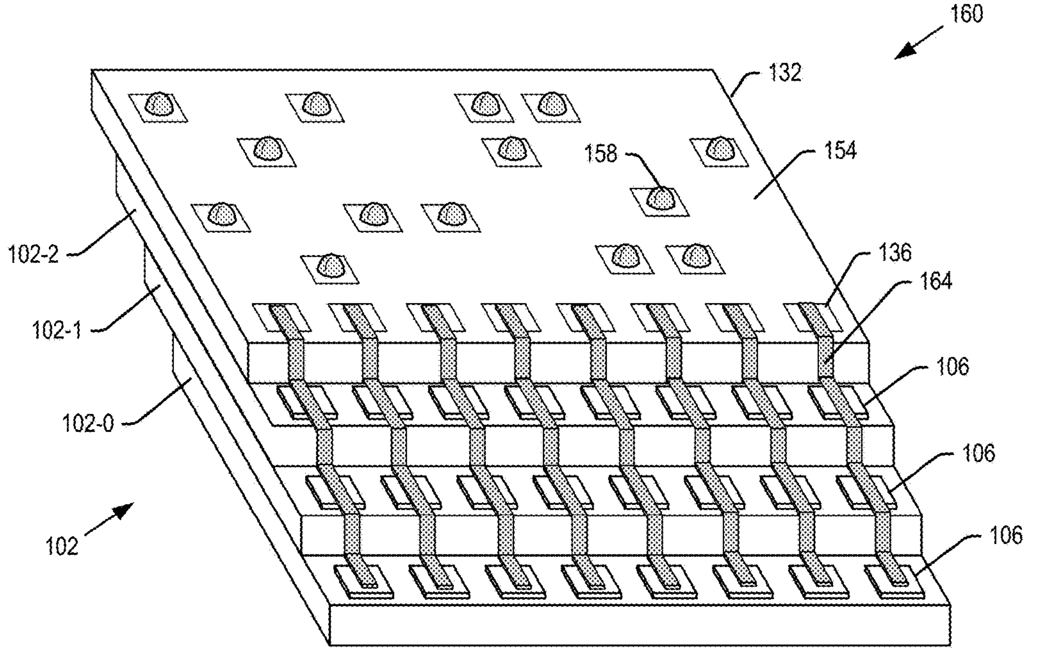
FIG. 13 is a perspective view of an electrically semiconductor die stack according to alternative embodiments of the present technology.

In the embodiment of semiconductor device 170 shown in FIGS. 10-12, each semiconductor stack 160 includes a pair of semiconductor dies 102, 132. In further embodiments, each semiconductor stack 160 may include more than two semiconductor dies. One such embodiment is shown in the perspective view of FIG. 13 and in the cross-sectional edge view of FIG. 14. FIG. 13 shows a single second semiconductor die 132 mounted on top of multiple first semiconductor dies 102. In the embodiment shown, the multiple semiconductor dies 102 comprise three such dies (individually labeled as dies 102-0, 102-1 and 102-2). However, there may be two such semiconductor dies 102, or more than three such semiconductor dies 102 in stack 160 in further embodiments. In examples, the semiconductor device 170 may include any number between three and sixty-three semiconductor dies 102, though there may be more in further embodiments.

In the embodiment shown FIG. 13, like channels each of the dies in stack 160 may be electrically coupled to each other using low height conductive traces 164 formed in contact with each corresponding bond pad down the stack. Each low height conductive trace 164 in this embodiment may be as described above, and formed according to any of the methods described above. However, in this embodiment, instead of merely electrically coupling the contact pads of two adjacent semiconductor dies, the conductive traces 164 are formed on the horizontal and/or vertical surfaces of each die in the stack 160 to electrically couple corresponding bond pads of each semiconductor die in stack 160.

Figure 14:
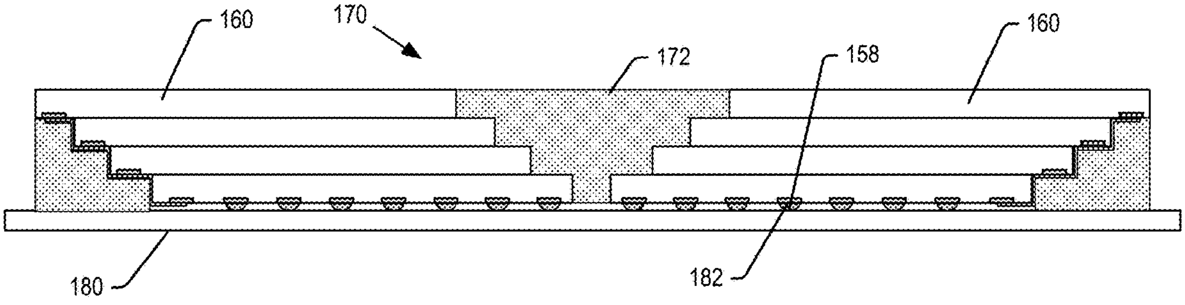
FIG. 14 is a cross-sectional edge view of a completed semiconductor device according to the alternative embodiment of FIG. 13.

As shown in the cross-sectional edge view of FIG. 14, once a semiconductor die stack 160 is formed, one or more such stacks may be encapsulated in molding compound 172 to form a completed semiconductor device 170. Such a device may then be flip chip mounted by solder bumps 158 to a host device 180 as described above and as shown in FIG. 14. While the embodiment of FIG. 14 includes two die stacks 160, it is understood that the semiconductor device 170 may include a single such stack 160 or more than two such stacks 160 in further embodiments. In embodiments, each stack 160 in semiconductor device 170 include the same number of semiconductor dies 102, 132.

The semiconductor device 170 of the present technology provides a number of advantages. For example, the device 170 is a low-height, flip chip semiconductor chip with more than one semiconductor die. Moreover, like channels of the respective semiconductor dies in the device 170 are electrically coupled without using bond wires, thus reducing the overall thickness of the semiconductor device 170. Furthermore, the semiconductor device 170 is a chip scale device which operates without the use of a substrate. Each of the above-described advantages enables a reduction in the thickness of the semiconductor device 170 as compared to conventional semiconductor packages. Moreover, elimination of the wire bonding process removes the risks of die cracking or chipping which can otherwise result from the wire bonding process. Furthermore, the conductive traces 164 described above offer better signal flow and lower parasitic capacitance as compared to conventional bond wires.

In summary, an example of the present technology relates to a semiconductor die stack comprising: a first semiconductor die, comprising: a first surface, a second surface opposed to the first surface, an edge extending between the first and second surfaces, and a first group of bond pads distributed across the first surface, the first group of bond pads configured to flip chip mount to a host device; a second semiconductor die, comprising: a third surface, a fourth surface opposed to the third surface, and a second group of bond pads in a row on the third surface adjacent and edge of the second semiconductor die, wherein the second surface of the first semiconductor die is affixed to the third surface of the second semiconductor die with an offset leaving the second group of bond pads on the third surface exposed; and a plurality of conductive traces electrically coupling like channels of bond pads in the first and second groups of bond pads, a conductive trace of the plurality of conductive traces comprising: a first portion affixed to a bond pad of the first group of bond pads and the first surface of the first semiconductor die, a second portion affixed to the edge between the first and second surfaces of the first semiconductor die, and a third portion affixed to a bond pad of the second group of bond pads and the third surface of the second semiconductor die.

In another example, the present technology relates to a semiconductor device comprising: one or more semiconductor die stacks, each semiconductor die stack or the one or more semiconductor dies stacks comprising: a first semiconductor die, comprising:

a first surface, a second surface opposed to the first surface, a first edge extending between the first and second surfaces, and a first group of bond pads distributed across the first surface, the first group of bond pads configured to flip chip mount to a host device; one or more second semiconductor dies, a second semiconductor die of the one or more second semiconductor dies comprising: a third surface, a fourth surface opposed to the third surface, a second edge extending between the third and fourth surfaces, a second group of bond pads in a row on the third surface adjacent and edge of the second semiconductor die, wherein the second surface of the first semiconductor die is affixed to the third surface of the second semiconductor die with an offset leaving the second group of bond pads on the third surface exposed; and a plurality of conductive traces electrically coupling like channels of bond pads in the first and second groups of bond pads, a conductive trace of the plurality of conductive traces comprising: a first portion affixed to a bond pad of the first group of bond pads and the first surface of the first semiconductor die, a second portion affixed to the edge between the first and second surfaces of the first semiconductor die, and a third portion affixed to a bond pad of the second group of bond pads and the third surface of the second semiconductor die.

In a further example, the present technology relates to a semiconductor die stack comprising: a first semiconductor die, comprising: a first surface, a second surface opposed to the first surface, an edge extending between the first and second surfaces, and a first group of bond pads distributed across the first surface, the first group of bond pads configured to flip chip mount to a host device; a second semiconductor die, comprising: a third surface, a fourth surface opposed to the third surface, and a second group of bond pads in a row on the third surface adjacent and edge of the second semiconductor die, wherein the second surface of the first semiconductor die is affixed to the third surface of the second semiconductor die with an offset leaving the second group of bond pads on the third surface exposed; and conductive means for electrically coupling like channels of bond pads in the first and second groups of bond pads, the conductive means affixed to the first surface of the first semiconductor die, the edge of the first semiconductor die between the first and second surfaces, and the third surface of the second semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor die stack comprising:

a first semiconductor die, comprising:

a first surface, a second surface opposed to the first surface, an edge extending between the first and second surfaces, and a first group of conductive pads distributed across the first surface, the first group of conductive pads configured to flip chip mount to a host device;

a second semiconductor die, comprising:

a third surface, a fourth surface opposed to the third surface, and a second group of conductive pads in a row on the third surface adjacent an edge of the second semiconductor die, wherein the second surface of the first semiconductor die is affixed to the third surface of the second semiconductor die with an offset leaving the second group of conductive pads on the third surface exposed; and a plurality of conductive traces electrically coupling like channels of conductive pads in the first and second groups of conductive pads, a conductive trace of the plurality of conductive traces comprising:

a first portion affixed to the first surface of the first semiconductor die, a second portion affixed to the edge between the first and second surfaces of the first semiconductor die, and a third portion affixed to a conductive pad of the second group of conductive pads and the third surface of the second semiconductor die;

wherein the first semiconductor die further comprises:

a third group of conductive pads in a row on the first surface adjacent the edge of the first semiconductor die, and a redistribution layer electrically coupling the first group of conductive pads distributed across the first surface to the third group of conductive pads in the row adjacent the edge of the first semiconductor die.

2. The semiconductor die stack of claim 1, wherein one or more of the first portion, second portion and third portion of the conductive trace are directly affixed to the first surface of the first semiconductor die.

3. The semiconductor die stack of claim 1, wherein the first portion of the conductive trace is physically coupled to a conductive pad in the third group of conductive pads.

4. The semiconductor die stack of claim 1, further comprising molding compound encapsulating at least portions of the first semiconductor die, the molding compound leaving exposed the first group of conductive pads on the first surface.

5. The semiconductor die stack of claim 1, wherein the conductive trace has a width less than or equal to a width of a conductive pad of the first group of conductive pads.

6. The semiconductor die stack of claim 1, further comprising a plurality of conductive bumps applied to the first group of conductive pads, wherein the plurality of conductive bumps enable flip chip mounting of the first group of conductive pads to the host device.

7. The semiconductor die stack of claim 1, wherein the plurality of conductive traces are formed by additive manufacturing.

8. The semiconductor die stack of claim 1, wherein the plurality of conductive traces are formed by screen printing.

9. A semiconductor device comprising:

one or more semiconductor die stacks, each semiconductor die stack of the one or more semiconductor dies stacks comprising:

a first semiconductor die, comprising:

a first surface, a second surface opposed to the first surface, a first edge extending between the first and second surfaces, and a first group of conductive pads distributed across the first surface, the first group of conductive pads configured to flip chip mount to a host device;

one or more second semiconductor dies, a second semiconductor die of the one or more second semiconductor dies comprising:

a third surface, a fourth surface opposed to the third surface, a second edge extending between the third and fourth surfaces, a second group of conductive pads in a row on the third surface adjacent an edge of the second semiconductor die, wherein the second surface of the first semiconductor die is affixed to the third surface of the second semiconductor die with an offset leaving the second group of conductive pads on the third surface exposed; and a plurality of conductive traces electrically coupling like channels of conductive pads in the first and second groups of conductive pads, a conductive trace of the plurality of conductive traces comprising:

a first portion affixed to the first surface of the first semiconductor die, a second portion affixed to the edge between the first and second surfaces of the first semiconductor die, and a third portion affixed to a conductive pad of the second group of conductive pads and the third surface of the second semiconductor die;

wherein the first semiconductor die further comprises:

a third group of conductive pads in a row on the first surface adjacent the edge of the first semiconductor die, and a redistribution layer electrically coupling the first group of conductive pads distributed across the first surface to the third group of conductive pads in the row adjacent the edge of the first semiconductor die.

10. The semiconductor die stack of claim 9, wherein the first portion of the conductive trace is physically coupled to a conductive pad in the third group of conductive pads.

11. The semiconductor device of claim 9, wherein the one or more semiconductor die stacks comprise two or more semiconductor die stacks.

12. The semiconductor device of claim 9, wherein the one or more one second semiconductor dies comprise a single second semiconductor die.

13. The semiconductor device of claim 9, wherein the one or more second semiconductor dies comprise two or more second semiconductor dies.

14. The semiconductor device of claim 13, wherein the electrically conductive trace is coupled to like channel conductive pads on each of the second semiconductor dies of the two or more second semiconductor dies.

15. The semiconductor device of claim 9, wherein the first portion of the conductive trace is directly affixed to the first surface of the first semiconductor die.

16. The semiconductor device of claim 9, wherein the second portion of the conductive trace is directly affixed to the edge of the first semiconductor die between the first and second surfaces.

17. The semiconductor device of claim 9, wherein the third portion of the conductive trace is directly affixed to the third surface of the second semiconductor die.

18. A semiconductor die stack comprising:

a first semiconductor die, comprising:

a first surface, a second surface opposed to the first surface, an edge extending between the first and second surfaces, and a first group of conductive pads distributed across the first surface, the first group of conductive pads configured to flip chip mount to a host device;

a second semiconductor die, comprising:

a third surface, a fourth surface opposed to the third surface, and a second group of conductive pads in a row on the third surface adjacent an edge of the second semiconductor die, wherein the second surface of the first semiconductor die is affixed to the third surface of the second semiconductor die with an offset leaving the second group of conductive pads on the third surface exposed; and conductive means for electrically coupling like channels of conductive pads in the first and second groups of conductive pads, the conductive means affixed to the first surface of the first semiconductor die, the edge of the first semiconductor die between the first and second surfaces, and the third surface of the second semiconductor die;

wherein the first semiconductor die further comprises:

a third group of conductive pads in a row on the first surface adjacent the edge of the first semiconductor die, and a redistribution layer electrically coupling the first group of conductive pads distributed across the first surface to the third group of conductive pads in the row adjacent the edge of the first semiconductor die.

* * * * *